United States Patent [19]

Flatley et al.

[11] Patent Number: 4,735,917
[45] Date of Patent: Apr. 5, 1988

[54] SILICON-ON-SAPPHIRE INTEGRATED CIRCUITS

[75] Inventors: Doris W. Flatley, Hillsboro Township, Somerset County; Kenneth M. Schlesier, Delaware Township, Hunterdon County, both of N.J.

[73] Assignee: General Electric Company, Schenectady, N.Y.

[21] Appl. No.: 856,280

[22] Filed: Apr. 28, 1986

[51] Int. Cl.$^4$ .................................. H01L 21/473
[52] U.S. Cl. .................................. 437/59; 437/61; 437/228; 437/233; 437/239
[58] Field of Search ............... 145/DIG. 150; 437/59, 437/61, 228, 233, 239

[56] References Cited

U.S. PATENT DOCUMENTS

| | | | |
|---|---|---|---|
| 3,511,702 | 5/1970 | Jackson, Jr. et al. | 117/212 |
| 3,740,280 | 6/1973 | Ronen | 156/11 |
| 3,890,632 | 6/1975 | Ham et al. | 357/23 |
| 3,943,542 | 3/1975 | Ho et al. | 357/23 |
| 3,974,515 | 8/1976 | Ipri et al. | 357/23 |
| 4,002,501 | 1/1977 | Tamura | 148/1.5 |
| 4,016,016 | 4/1977 | Ipri | 148/175 |
| 4,076,573 | 2/1978 | Shaw et al. | 156/613 |
| 4,160,260 | 7/1979 | Weitzel et al. | 357/23 |
| 4,174,217 | 11/1979 | Flatley | 96/36.2 |
| 4,178,191 | 12/1979 | Flatley | 148/1.5 |
| 4,183,134 | 1/1980 | Dehler et al. | 29/571 |
| 4,199,384 | 4/1980 | Hsu | 148/174 |
| 4,199,773 | 4/1980 | Goodman et al. | 357/23 |
| 4,242,156 | 12/1980 | Peel | 148/175 |
| 4,252,582 | 2/1981 | Anantha et al. | 148/175 |
| 4,263,709 | 4/1981 | Weitzel et al. | 29/571 |
| 4,277,884 | 7/1981 | Hsu | 29/571 |
| 4,313,809 | 2/1982 | Benyon | 204/192 |
| 4,323,910 | 4/1982 | Sokoloski et al. | 357/23 |
| 4,341,569 | 3/1982 | Yaron et al. | 148/1.5 |
| 4,356,623 | 11/1982 | Hunter | 29/571 |
| 4,368,085 | 1/1983 | Peel | 148/33.3 |
| 4,385,937 | 5/1983 | Ohmura | 148/1.5 |
| 4,393,572 | 7/1983 | Policastro et al. | 29/571 |
| 4,393,578 | 7/1983 | Cady et al. | 29/576 |
| 4,395,726 | 7/1983 | Maeguchi | 357/41 |
| 4,447,823 | 5/1984 | Maeguchi et al. | 357/23 |
| 4,455,738 | 6/1984 | Houston et al. | 29/571 |
| 4,472,459 | 9/1984 | Fisher | 427/93 |
| 4,491,856 | 1/1985 | Egawa et al. | 357/4 |
| 4,523,963 | 6/1985 | Ohta et al. | 148/1.5 |
| 4,533,934 | 8/1985 | Smith | 357/23.7 |
| 4,547,231 | 10/1985 | Hine | 148/175 |
| 4,557,794 | 12/1985 | McGinn et al. | 156/612 |
| 4,604,304 | 8/1986 | Faraone et al. | 427/255 |
| 4,658,495 | 4/1987 | Flatley et al. | 29/571 |

FOREIGN PATENT DOCUMENTS 0179719 4/1986 European Pat. Off. ... 148/DIG. 150
133667 8/1982 Japan .

OTHER PUBLICATIONS

Ansell et al., "CMOS in Radiation Environments," VLSI Systems, Sep. 1986, pp. 28–36.

List continued on next page.

Primary Examiner—Olik Chaudhuri
Attorney, Agent, or Firm—R. Hain Swope; James M. Trygg; Allen LeRoy Limberg

[57] ABSTRACT

A process for forming a silicon-on-sapphire integrated circuit comprises forming a layer of a conformal dielectric material, such as silicon dioxide, over a sapphire substrate having at least one island of silicon on a major surface thereof; forming a layer of a planarizing material over the dielectric layer, anisotropically etching the planarizing material for a time sufficient to expose the surface of the dielectric layer overlying the island; etching the dielectric layer for a time sufficient to expose at least the top surface of the island; removing the remaining planarizing material, growing a thin layer of gate oxide on the exposed surface of the island and providing a patterned layer of conductive polycrystalline silicon thereover. The etching of the dielectric layer can be continued to at least partially expose the sidewall surface of the islands. Preferably, etching is continued for a time sufficient to completely expose the sidewall surfaces of the islands and a portion of the surface adjacent thereto. A separate MOSFET is formed on each island and includes source and drain regions spaced by a channel region and a channel dielectric over the channel region.

8 Claims, 2 Drawing Sheets

OTHER PUBLICATIONS

Hughes et al., "Oxide Thickness Dependence of High–Energy-Electron-, VUV-, and Corona-Induced Charge in MOS Capacitors," Applied Physics Letters, vol. 29, No. 6, Sep. 15, 1976, pp. 377–379.

Naruke et al., "Radiation–Induced Interface States of Poly–Si Gate MOS Capacitors Using Low Temperature Gate Oxidation," IEEE Transactions on Nuclear Science, vol. NS–30, No. 6, Dec. 1983, pp. 4054–4058.

Saks et al., "Radation Effects in MOS Capacitors with Very Thin Oxides at 80° K.," IEEE Transactions on Nuclear Science, vol. NS–31, No. 6, Dec. 1984, pp 1249–1255.

K. Tanno et al., "Selective Silicon Epitaxy Using Reduced Pressure Technique," Japanese Journal of Applied Physics, vol. 21, No. 9, Sep. 1982, pp. L564–566

W. E. Ham, "The Study of Microcircuits by Transmission Electron Microscopy", RCA Review, vol. 38, Sep 1977, pp. 351–389.

J. S. Chang, "Selective Reactive Ion Etching of Silicon Dioxide," Solid State Technology, Apr. 1984, pp 214–219.

SILICON-ON-SAPPHIRE INTEGRATED CIRCUITS

The government has rights to this invention pursant to Subcontract No. A5ZV-522881-E-507 under Contract No. F04704-84-C-0061 awarded by the Department of the Air Force.

The present invention relates to a process of forming a silicon-on-sapphire integrated circuit which includes metal oxide semiconductor field-effect transistors (MOSFETs) and more particularly, to such a circuit having improved radiation-hardened characteristics.

BACKGROUND OF THE INVENTION

A silicon-on-sapphire (SOS) integrated circuit typically includes a plurality of spaced, isolated islands of single-crystalline silicon on the surface of a sapphire substrate. Each island may include a MOSFET which has source and drain regions spaced by a channel region, a channel oxide layer over at least the channel region and a conductive gate on the oxide layer and over the channel region. The various MOSFETs are electrically connected to form a desired circuit, such as a complementary MOS (CMOS) integrated circuit. The MOSFETs are typically electrically connected, at least in part, by conductive interconnects of doped polycrystalline silicon.

When SOS devices are subjected to radiation, the passage of radiation through the sapphire substrate creates secondary electrons. These secondary electrons have a high kinetic energy, greater than 20 electron volts for sapphire, which is rapidly lost through scattering events until they are thermalized to the conduction band. These electrons then drift in an electric field, causing current flow, until they are trapped, recombined with ionized core atoms, or pass through device contacts. Thus, in an SOS integrated circuit in which polycrystalline silicon conductive interconnects are directly on the surface of the sapphire substrate, the radiation generated electrons in the sapphire will flow directly into the interconnects which will conduct the electrons directly into field-effect transistors in the silicon islands. This flow of electrons can adversely affect the operation of the SOS integrated circuit.

SUMMARY OF THE INVENTION

There is disclosed a process of forming an integrated circuit which includes an insulating substrate, e.g. sapphire, having at least one island of monocrystalline silicon on a major surface thereof. A thin conformal layer of a dielectric material, e.g. silicon dioxide, is formed over the substrate and the islands. A layer of a suitable planarizing material is deposited over the dielectric material to a thickness greater than the thickness of the islands. The planarizing layer is anisotropically etched until the dielectric layer on the top of the islands is exposed. The dielectric layer is then etched until at least the top surface of the islands is exposed. Etching may be continued to partially expose the sidewall surface of the islands. In a preferred embodiment, etching is continued to expose all of the sidewalls of the islands and a portion of the substrate adjacent thereto. The remaining planarizing layer is removed and a thin layer of silicon dioxide is formed on the exposed surfaces of the islands. Preferably, there is a separation between the silicon dioxide layer on the islands and the dielectric material on the substrate. A patterned layer of conductive silicon is provided thereover.

DETAILED DESCRIPTION OF THE PREFERRED EMBODIMENT

Figure 1:
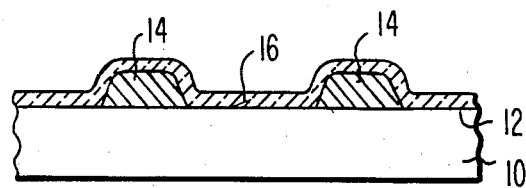
FIGS. 1-6 are sectional views illustrating in sequence the various steps of the present invention.

In FIG. 1, silicon islands 14, suitably monocrystalline silicon, have been formed on a major surface 12 of an insulating substrate 10, such as sapphire. While the process of the present invention is particularly advantageous in the formation of a silicon-on-sapphire integrated circuit, it is equally applicable to other monocrystalline insulating substrates, such as beryllia or spinel, or amorphous substrates, such as glass. When the substrate 10 is amorphous the silicon islands 14 are typically polycrystalline. The silicon islands 14 are formed, e.g. by depositing a layer of silicon over the substrate 10 and lithographically defining it utilizing conventional techniques. The silicon islands are suitably from about 200 to 1000 nm thick.

A layer of conformal dielectric material 16 is formed over the substrate 10 and the islands 14. By a conformal layer is meant a layer having a substantially uniform thickness throughout. The conformal layer 16 is suitably silicon dioxide, although other conventional dielectric materials such as silicon nitride or silicon oxynitride could be utilized as well. The conformal dielectric layer 16 is deposited by conventional means such as chemical vapor deposition (CVD), plasma enhanced chemical vapor deposition (PECVD), low pressure chemical vapor deposition (LPCVD) and the like. The conformal dielectric layer 16 is thinner than the silicon islands 14 and is suitably from about 50 to 500, preferably from about 80 to 100, nanometers thick.

Figure 2:
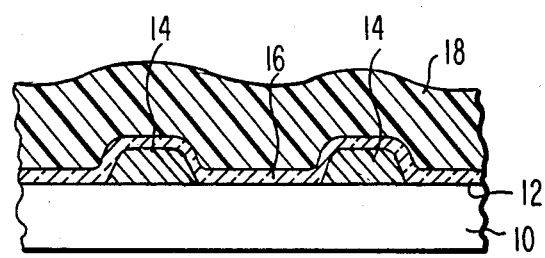

A thick layer of a suitable planarizing material 18 is deposited over the conformal dielectric layer 16 as shown in FIG. 2. The planarizing material 18 is conventionally applied, preferably by spin-coating, and then baked to enhance planarization and remove residual solvent. The planarizing material 18 is typically a positive resist material such as HPR 206 of Philip A. Hunt Chemical Corp., AZ 1450J of the Shipley Company and the like. Other suitable organic materials which could be utilized to form the planarizing layer 18 include certain polyimides and poly(methylmethacrylate). Although the polyimides have a greater temperature processing latitude, the positive resist materials are generally preferred because of their superior planarizing capability and, particularly, their purity. It is necessary that the planarizing material have resistance to the etchant utilized to etch the dielectric layer 16 as will be discussed. The planarizing layer is substantially thicker than the silicon islands and, after baking, would be thicker where it overlies the substrate 10 than where it overlies the silicon islands 14. Generally, the thickness of the planarizing layer 18, measured over the substrate 10, is at least twice the thickness of the silicon islands.

Figure 3:
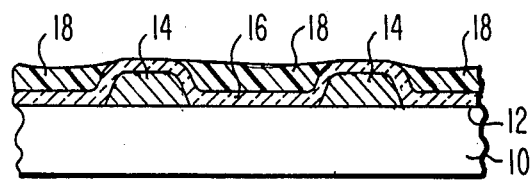
Figure 4:
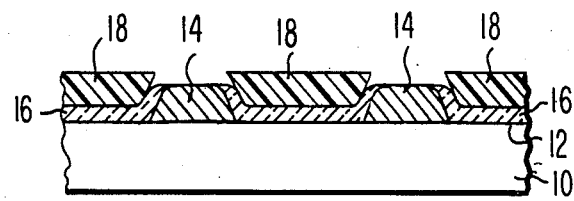
Figure 5:
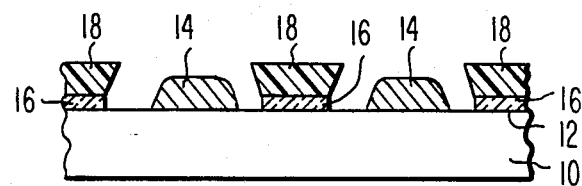

The planarizing layer 18 is anisotropically etched by conventional dry etching, e.g. reactive ion etching utilizing a plasma such as oxygen or combinations thereof with other gases, for a time sufficient to expose the top surface of the dielectric layer 16 overlying the islands 14 as shown in FIG. 3. The exposed dielectric layer 16 is then etched, suitably by wet etching utilizing, e.g. dilute hydrofluoric acid, or dry etching utilizing a plasma such as carbon tetrafluoride, for a time sufficient to expose at least the top surface of the islands 14 as shown in FIG. 4. The etching of the dielectric layer 16 may be continued to etch the exposed portion thereof adjacent to the silicon islands 14, thus partially exposing the sidewalls of silicon islands 14. Preferably, etching is continued until the sidewalls of the islands 14 and a portion of the substrate adjacent thereto are exposed as shown in FIG. 5. When the dielectric layer 16 is initially dry etched to expose the top of the islands 14, the extended etch is suitably carried out by wet etching. The remaining portion of the planarizing layer 18 is then removed, e.g. with a suitable organic solvent.

Figure 6:
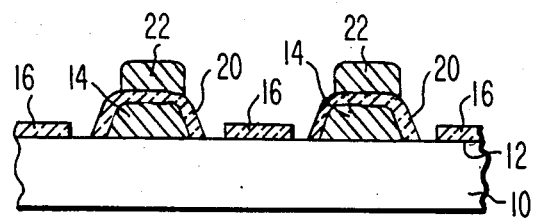

MOSFETs can then be formed in the islands 14 using any conventional technique. For example, as shown in FIG. 6, a thin layer of silicon dioxide 20 is formed on the surface and exposed sidewall surfaces of the islands 14, suitably by thermal oxidation of the islands 14 for a time sufficient to form the necessary thickness of oxide. The silicon dioxide layer 20 is suitably from about 10 to 50 nm in thickness, measured on the top of the islands 14. The thin silicon dioxide layer 20 overlying the islands 14 will form the channel dielectric of the devices to be formed thereon. Preferably, the silicon dioxide layer 20 overlying the islands 14 does not contact the dielectric layer 16 on the substrate surface 12. Although a separation of several nanometers is preferred between layers 20 and 16, the extent thereof is not critical to the subject invention. It has been found that devices having a separation between layers 16 and 20 have improved radiation hardening characteristics in comparison to devices having a continuous dielectric layer.

An electrode, suitably comprising a layer of conductive polycrystalline silicon, is then formed on the dielectric layers 16 and 20. The polycrystalline silicon layer may be made conductive by doping with a suitable impurity, such as phosphorus, suitably by adding a source of the impurity, e.g. phosphine, to the silane utilized to form the polysilicon layer by, e.g. low pressure chemical vapor deposition. The conductive polycrystalline silicon electrode is then conventionally, e.g. lithographically, defined to form strips 22 extending across portions of the islands 14 which are to be the channel regions of the MOSFETs as shown in FIG. 6. The strips of doped, conductive polycrystalline silicon 22 provide the desired connection between devices. Using the strips of polycrystalline silicon 22 as a mask, ions of an appropriate conductivity type material are then implanted into the islands 14 to form the source and drain regions of the MOSFETs. Additional strips of conductive polycrystalline silicon may be formed on the device to make ohmic contact with the source and drain regions formed in the islands 14 and electrically connect the various MOSFETs in a desired circuit arrangement in known manner.

The process of this invention is advantageous in that the polycrystalline silicon interconnects are not directly on the surface of the sapphire substrate 10 but are on an intermediate layer of silicon dioxide or other suitable dielectric 16 which has a higher band gap than sapphire and thereby forms a potential barrier to electron flow. The dielectric layer 16 thus will prevent or at least minimize the flow of radiation induced electrons from the sapphire substrate 10 to the polycrystalline silicon conductive lines and thereby prevent any adverse effect to the integrated circuit as a result of the radiation. This advantage is enhanced by the separation of the silicon dioxide layer 20 and the dielectric layer 16 even though there is minimal contact between the interconnect and the substrate in the separation.

The subject process also provides a means for controlling the thickness of the gate oxide layer 20 formed on the top and the sidewalls of the isolated islands 14. This is advantageous to the performance of a device such as a MOSFET formed in the islands and the circuit formed therefrom.

The invention has been described with reference to preferred embodiments thereof. It will be appreciated by those skilled in the art that various modifications may be made from the specific details given without departing from the spirit and scope of the invention.

We claim:

1. A process of forming an integrated circuit including the steps of:
    providing an insulating substrate having at least one island of silicon on a major surface thereof;
    depositing a layer of a conformal dielectric material over the island and the substrate, the thickness of said layer being less than the thickness of the island;
    depositing a layer of a planarizing material over the layer of dielectric material;
    etching the dielectric material with an etchant which does not substantially erode the remaining planarizing material for a time sufficient to expose the top surface and at least partially expose the sidewall surfaces of the islands;
    removing the remaining planarizing material;
    oxidizing the exposed surface of the silicon island to form a thin layer of silicon dioxide thereon; and
    providing a patterned layer of conductive polycrystalline silicon over the thin layer of silicon dioxide.

2. A process in accordance with claim 1, wherein the insulating substrate is sapphire and the conformal dielectric material is silicon dioxide.

3. A process in accordance with claim 1, wherein the silicon island is monocrystalline silicon.

4. A process in accordance with claim 1, wherein the conformal dielectric layer is deposited on the substrate and island by plasma enhanced chemical vapor deposition.

5. A process in accordance with claim 1, wherein etching of the dielectric layer is continued for a time sufficient to completely expose the sidewall surfaces of the island and a portion of the surface of the substrate adjacent thereto.

6. A process in accordance with claim 5, wherein a sufficient portion of the substrate is exposed adjacent to the sidewalls of the islands so that, after the exposed surfaces of the island are oxidized, there is a separation between the resulting layer of silicon dioxide and the remaining layer of dielectric material.

7. A process in accordance with claim 1, wherein the planarizing material is an organic positive resist material.

8. A process in accordance with claim 7, wherein the planarizing material remaining after etching of the dielectric layer is completed is removed with an organic solvent.

* * * * *